United States Patent
Kim et al.

(10) Patent No.: US 8,466,739 B2
(45) Date of Patent: Jun. 18, 2013

(54) 3D CHIP STACK SKEW REDUCTION WITH RESONANT CLOCK AND INDUCTIVE COUPLING

(75) Inventors: Jae-Joon Kim, Yorktown Heights, NY (US); Yu-Shiang Lin, Elmsford, NY (US); Liang-Teck Pang, White Plains, NY (US); Joel A. Silberman, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/607,089

(22) Filed: Sep. 7, 2012

(65) Prior Publication Data

US 2013/0049826 A1 Feb. 28, 2013

Related U.S. Application Data

(63) Continuation of application No. 13/217,349, filed on Aug. 25, 2011.

(51) Int. Cl.
H01L 25/00 (2006.01)

(52) U.S. Cl.
USPC ..... 327/565; 327/564; 257/691; 257/E23.141

(58) Field of Classification Search
USPC .......... 257/665, 676, 686, 691–693, E23.141, 257/E23.144, E23.145; 327/564–565
See application file for complete search history.

(56) References Cited

U.S. PATENT DOCUMENTS

| | | | |
|---|---|---|---|
| 4,868,712 A | 9/1989 | Woodman | |
| 5,200,631 A | 4/1993 | Austin et al. | |
| 5,280,184 A | 1/1994 | Jokerst et al. | |
| 5,655,290 A | 8/1997 | Moresco et al. | |
| 5,702,984 A | 12/1997 | Bertin et al. | |
| 6,141,245 A | 10/2000 | Bertin et al. | |
| 6,258,623 B1 | 7/2001 | Moden et al. | |
| 6,569,762 B2 | 5/2003 | Kong | |
| 6,982,869 B2 | 1/2006 | Larson | |
| 7,021,520 B2 | 4/2006 | Bowen | |
| 7,030,486 B1 | 4/2006 | Marshall | |
| 7,067,910 B2 | 6/2006 | Drost et al. | |
| 7,521,950 B2 | 4/2009 | Bernstein et al. | |
| 7,615,869 B2 | 11/2009 | Koo et al. | |
| 7,623,398 B2 | 11/2009 | Arai | |
| 7,701,251 B1 | 4/2010 | Rahman et al. | |
| 7,710,329 B2 | 5/2010 | Chiozzi | |
| 7,753,779 B2 | 7/2010 | Shayesteh | |
| 7,768,790 B2 | 8/2010 | Kuroda et al. | |

(Continued)

OTHER PUBLICATIONS

Badaroglu et al., "Clock-skew-optimization methodology for substrate-noise reduction with supply-current folding" ICCAD, vol. 25. No. 6, pp. 1146-1154, Jun. 2006.

(Continued)

*Primary Examiner* — An Luu
(74) *Attorney, Agent, or Firm* — Tutunjian & Bitetto, P.C.; Louis J. Percello (57) ABSTRACT

There is provided a clock distribution network for synchronizing global clock signals within a 3D chip stack having two or more strata. The clock distribution network includes a plurality of clock distribution circuits, each being arranged on a respective one of the two or more strata for providing the global clock signals to various chip locations. Each of the plurality of clock distribution circuits includes a resonant circuit for providing stratum-to-stratum coupling for the clock distribution network. The resonant circuit includes at least one capacitor and at least one inductor.

20 Claims, 4 Drawing Sheets

U.S. PATENT DOCUMENTS

| | | |
|---|---|---|
| 7,772,708 B2 | 8/2010 | Leddige et al. |
| 7,830,692 B2 | 11/2010 | Chung et al. |
| 7,863,960 B2 | 1/2011 | Wang et al. |
| 2002/0089831 A1 | 7/2002 | Forthun |
| 2004/0177237 A1 | 9/2004 | Huppenthal et al. |
| 2005/0058128 A1 | 3/2005 | Carson et al. |
| 2006/0043598 A1 | 3/2006 | Kirby et al. |
| 2007/0033562 A1 | 2/2007 | Corraele et al. |
| 2007/0047284 A1 | 3/2007 | Silvestri |
| 2007/0132070 A1 | 6/2007 | Bout et al. |
| 2007/0287224 A1 | 12/2007 | Alam et al. |
| 2007/0290333 A1 | 12/2007 | Saini et al. |
| 2008/0068039 A1 | 3/2008 | Bernstein et al. |
| 2008/0204091 A1 | 8/2008 | Choo et al. |
| 2009/0024789 A1 | 1/2009 | Rajan et al. |
| 2009/0055789 A1 | 2/2009 | McIlrath |
| 2009/0064058 A1 | 3/2009 | McIlrath |
| 2009/0070549 A1 | 3/2009 | Solomon |
| 2009/0070721 A1 | 3/2009 | Solomon |
| 2009/0168860 A1 | 7/2009 | Magagni et al. |
| 2009/0196312 A1 | 8/2009 | Kuroda |
| 2009/0237970 A1 | 9/2009 | Chung |
| 2009/0245445 A1 | 10/2009 | Saen et al. |
| 2009/0323456 A1 | 12/2009 | Gomm |
| 2010/0001379 A1 | 1/2010 | Lee et al. |
| 2010/0005437 A1 | 1/2010 | McIlrath |
| 2010/0044846 A1 | 2/2010 | Ohmi et al. |
| 2010/0059869 A1 | 3/2010 | Kaskoun et al. |
| 2010/0332193 A1 | 12/2010 | Hu et al. |
| 2011/0016446 A1 | 1/2011 | Krebs |
| 2011/0032130 A1 | 2/2011 | Ludwig |
| 2011/0121811 A1 | 5/2011 | Dennard et al. |

OTHER PUBLICATIONS

Chan et al., "A Resonant Global Clock Distribution for the Cell Broadband Engine Processor" IEEE J. Solid State Circuits, vol. 44, No. 1, pp. 64-72, Jan. 2009.

Gutnik et al., "Active GHz Clock Network Using Distributed PLLs" IEEE JSSC, vol. 35, No. 11, pp. 1553-1560, Nov. 2000.

Lam et al., "Power supply noise suppression via clock skew scheduling," in Proceedings of International Symposium on Quality Electronic Design, pp. 355-360, Mar. 2002.

Miura et al., "A 2.7Gb/s/mm2 0.9pj/b/Chip 1Coil/Channel ThruChip Interface with Coupled-Resonator-Based CDR for NAND Flash Memory Stacking," ISSCC, pp. 490-491, Feb. 2011.

Pavlidis et al., "Clock distribution networks for 3-D integrated Circuits", IEEE CICC, pp. 651-654, Sep. 2008.

Restle et al., "A Clock Distribution Method for Microprocessors", IEEE JSSC, vol. 36, No. 5, pp. 792-799, May 2001.

Tam et al., "Clock Generation and distribution for the first IA-64 Microprocessor", IEEE JSSC vol. 35, No. 11, pp. 1545-1552, Nov. 2000.

3D CHIP STACK SKEW REDUCTION WITH RESONANT CLOCK AND INDUCTIVE COUPLING

CROSS-REFERENCE TO RELATED APPLICATIONS

This application is a Continuation application of co-pending U.S. patent application Ser. No. 13/217,349 filed on Aug. 25, 2011, incorporated herein by reference in its entirety.

This application is related to the following commonly assigned applications, all concurrently filed on Aug. 25, 2011 and incorporated herein by reference: U.S. application Ser. No. 13/217,734, entitled "PROGRAMMING THE BEHAVIOR OF INDIVIDUAL CHIPS OR STRATA IN A 3D STACK OF INTEGRATED CIRCUITS"; U.S. application Ser. No. 13/217,335, entitled "SYNCHRONIZING GLOBAL CLOCKS IN 3D STACKS OF INTEGRATED CIRCUITS BY SHORTING THE CLOCK NETWORK"; U.S. application Ser. No. 13/217,767, entitled "3D INTEGRATED CIRCUIT STACK-WIDE SYNCHRONIZATION CIRCUIT"; U.S. application Ser. No. 13/217,789, entitled "CONFIGURATION OF CONNECTIONS IN A 3D STACK OF INTEGRATED CIRCUITS"; U.S. application Ser. No. 13/217,381, entitled "3D INTER-STRATUM CONNECTIVITY ROBUSTNESS"; U.S. application Ser. No. 13/217,406, entitled "AC SUPPLY NOISE REDUCTION IN A 3D STACK WITH VOLTAGE SENSING AND CLOCK SHIFTING"; and U.S. application Ser. No. 13/217,429, entitled "VERTICAL POWER BUDGETING AND SHIFTING FOR 3D INTEGRATION".

BACKGROUND

1. Technical Field

The present invention relates generally to integrated circuits and, in particular, to 3D chip stack skew reduction with resonant clock and inductive coupling.

2. Description of the Related Art

Three-dimensional (3D) stacked chips include two or more electronic integrated circuit chips stacked one on top of the other. Three-dimensional integration offers the advantages of heterogeneous design and higher input/output (I/O) density for designers. However, clock distribution across the chip can be challenging considering wafer-to-wafer variation and even stacking chips with different technologies.

SUMMARY

According to an aspect of the present principles, there is provided a clock distribution network for synchronizing global clock signals within a 3D chip stack having two or more strata. The clock distribution network includes a plurality of clock distribution circuits, each being arranged on a respective one of the two or more strata for providing the global clock signals to various chip locations. Each of the plurality of clock distribution circuits includes a resonant circuit for providing stratum-to-stratum coupling for the clock distribution network. The resonant circuit includes at least one capacitor and at least one inductor.

According to another aspect of the present principles, there is provided a method for synchronizing global clock signals in a clock distribution network in a 3D chip stack having two or more strata. The method includes arranging each of a plurality of clock distribution circuits on a respective one of the two or more strata to provide the global clock signals to various chip locations. The method further includes configuring a respective resonant circuit included in each of the plurality of clock distribution circuits to provide stratum-to-stratum coupling for the clock distribution network. The resonant circuit includes at least one capacitor and at least one inductor.

According to yet another aspect of the present principles, there is provided a clock distribution network for synchronizing global clock signals within a 3D chip stack having two or more strata. The clock distribution network includes a plurality of clock grids, each being arranged on a respective one of the two or more strata for providing the global clock signals to various chip locations. The clock distribution network further includes a plurality of buffered clock trees, each being arranged on the respective one of the two or more strata for driving a respective one of the plurality of clock grids on a same one of the two or more strata and having at least a root and a plurality of clock buffers. The clock distribution network also includes a plurality of multiplexers, each being arranged on the respective one of the two or more strata. The plurality of multiplexers are for providing a same single clock source to the root of each of the plurality of buffered clock trees. Each of the plurality of clock grids includes at least one sector having a resonant circuit therein for providing stratum-to-stratum coupling for the clock distribution network.

According to still another aspect of the present principles, there is provided a method for synchronizing global clock signals in a clock distribution network in a 3D chip stack having two or more strata. The method includes arranging each of a plurality of clock grids on a respective one of the two or more strata to provide the global clock signals to various chip locations. The method further includes arranging each of a plurality of buffered clock trees on the respective one of the two or more strata to drive a respective one of the plurality of clock grids on a same one of the two or more strata. Each of the plurality of buffered clock trees has at least a root and a plurality of clock buffers. The method also includes arranging each of a plurality of multiplexers on the respective one of the two or more strata. The plurality of multiplexers are configured to provide a same single clock source to the root of each of the plurality of buffered clock trees. The method additionally includes configuring a resonant circuit included in each of the plurality of clock grids to provide stratum-to-stratum coupling for the clock distribution network.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to 3D chip stack skew reduction with resonant clock and inductive coupling.

Figure 1:
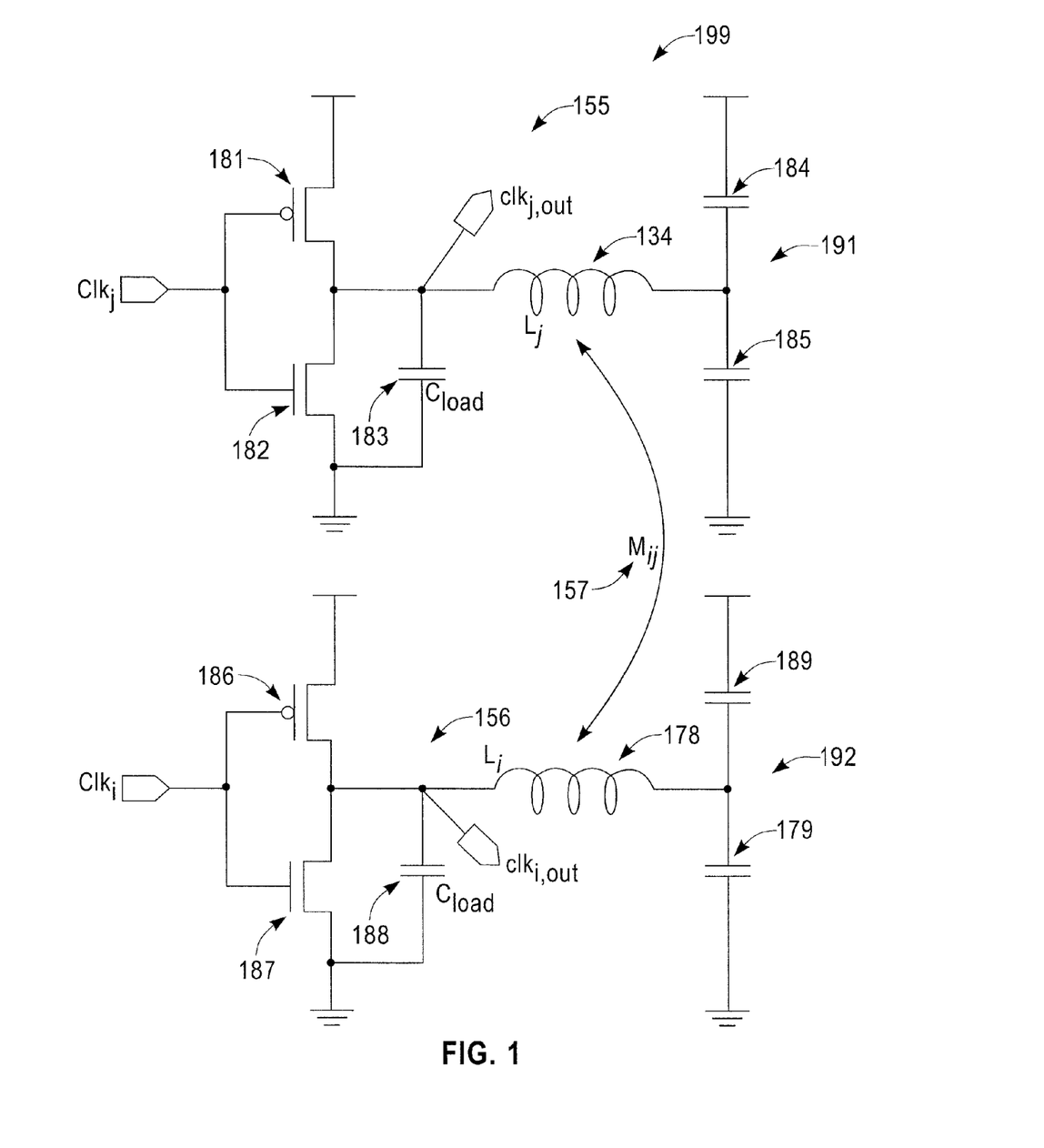
FIG. 1 shows resonant circuits 155 and 156 in a 3D chip stack 199, in accordance with an embodiment of the present principles.

FIG. 1 shows resonant circuits 155 and 156 in a 3D chip stack 199, in accordance with an embodiment of the present principles. Stack 199 includes a stratum-0 191 and a stratum-1 192.

Regarding stratum-0 191, a clock signal $clk_j$ is applied to the respective gates of a p-channel MOSFET 181 and an n-channel MOSFET 182. A source of the p-channel MOSFET 181 is connected to a voltage or current source (not shown). A drain of the p-channel MOSFET 181 is connected to the drain of the n-channel MOSFET 182, one side of a capacitor $C_{load}$ 183, and one side of an inductor $L_j$ 134, forming an output resonant clock node $clk_{j,out}$. The source of the n-channel MOSFET 182 is connected to ground and to the other side of capacitor $C_{load}$ 183. The other side of inductor $L_j$ 134 is connected to one side of a capacitor 184 and one side of a capacitor 185. The other side of capacitor 184 is connected to a voltage or current source (not shown). The other side of capacitor 185 is connected to ground. Inductor $L_j$ 134 and capacitor $C_{load}$ 183 form a resonant circuit 155 on stratum-0 191.

Regarding stratum-1 192, a clock signal $clk_i$ is applied to the respective gates of a p-channel MOSFET 186 and an n-channel MOSFET 187. A source of the p-channel MOSFET 186 is connected to a voltage or current source (not shown). A drain of the p-channel MOSFET 186 is connected to the drain of the n-channel MOSFET 187, one side of a capacitor $C_{load}$ 188, and one side of an inductor $L_i$ 178, forming an output resonant clock node $clk_{i,out}$. The source of the n-channel MOSFET 187 is connected to ground and to the other side of capacitor $C_{load}$ 188. The other side of inductor $L_i$ 178 is connected to one side of a capacitor 189 and one side of a capacitor 179. The other side of capacitor 189 is connected to a voltage or current source (not shown). The other side of capacitor 179 is connected to ground. Inductor $L_i$ 178 and capacitor $C_{load}$ 188 form a resonant circuit 156 on stratum-1 192.

A mutual coupling $M_{ij}$ 157 is obtained between the inductors $L_j$ 134 and $L_i$ 178. The mutual coupling $M_{ij}$ 157 assists in "pulling in" the phase difference between the two resonant clock nodes $clk_{i,out}$ and $clk_{j,out}$ through injection locking. Advantageously, the mutual coupling $M_{ij}$ 157 eliminates the need for physically connecting the clock network through the chip stack 199. Such an approach, when contrasted to an approach involving shorting of the clock network using chip-to-chip interconnects, provides reduced input/output (I/O) overhead, better power efficiency, reduced alternating current (AC) supply noise, and offers 180 degree clock distribution in neighboring stratums by simply changing the direction of the current flow.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

It is to be further appreciated that while one or more embodiments described herein may refer to the use of Silicon with respect to a chip or a through via, the present principles are not limited to using only chips or vias made from Silicon and, thus, chips or vias made from other materials including but not limited to Germanium and Gallium Arsenide may also be used in accordance with the present principles while maintaining the spirit of the present principles. Moreover, it is to be further appreciated that while one or more embodiments described herein may refer to the use of C4 or micro C4 (uC4) connections, the present principles are not limited to solely using C4 or micro C4 connections and, thus, other types of connections may also be used while maintaining the spirit of the present principles.

It is to be understood that the present invention will be described in terms of a given illustrative architecture having a wafer; however, other architectures, structures, substrate materials and process features and steps may be varied within the scope of the present invention.

It will also be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 2:
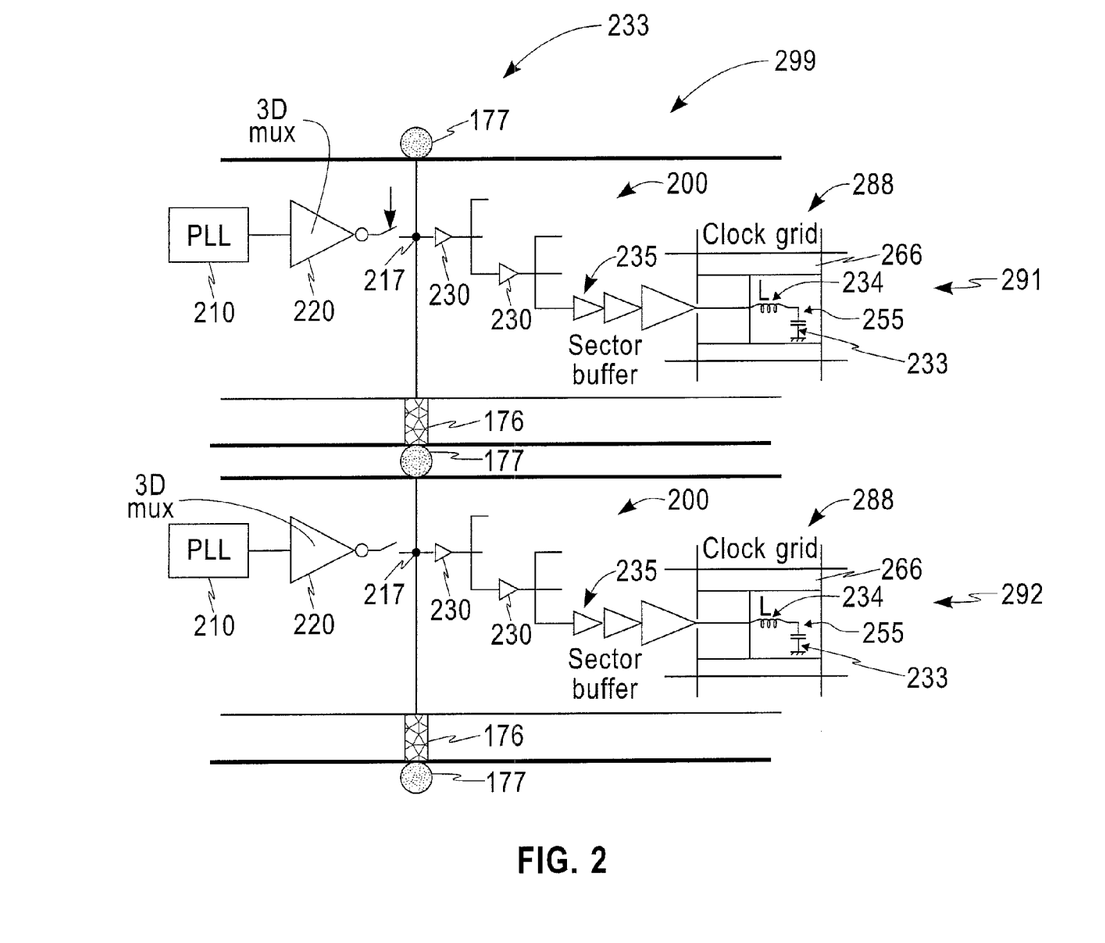
FIG. 2 shows a clock distribution circuit 233 with resonant circuits 255 for a 3D chip stack 299, in accordance with an embodiment of the present principles.

FIG. 2 shows a clock distribution circuit 233 with resonant circuits 255 for a 3D chip stack 299, in accordance with an embodiment of the present principles. The clock distribution network 233 includes clock trees 200. Each stratum of a 3D chip stack 299 includes a respective one of the clock trees 200. Stack 299 includes a stratum-0 291 and a stratum-1 292.

The clock trees 200 have a single clock source 210 (e.g., a phase locked loop (PLL)), selectable using a 3D mux 220, for driving the root 217 of the clock trees in all strata. The trees 200 include clock relay buffers 230 and sector buffers 235. Each clock grid 288 is driven by a respective sector buffer 235. The clock relay buffers 230 relay the global clock signals. The clock source is selected by a 3D mux 220 from one of the strata (strata 291 and 292) and connected using through-Silicon vias (TSVs) 276 and micro C4 connections (μC4) 277. The balanced clock trees 200 distribute the clock to macro clock pins (not shown).

A resonant (LC tank) circuit 255 is added to each sector 266 of a respective clock grid 288 that is driven by the sector buffer 235. The LC tank circuit 255 includes a capacitor (C) 233 and an inductor (L) 234.

Figure 3:
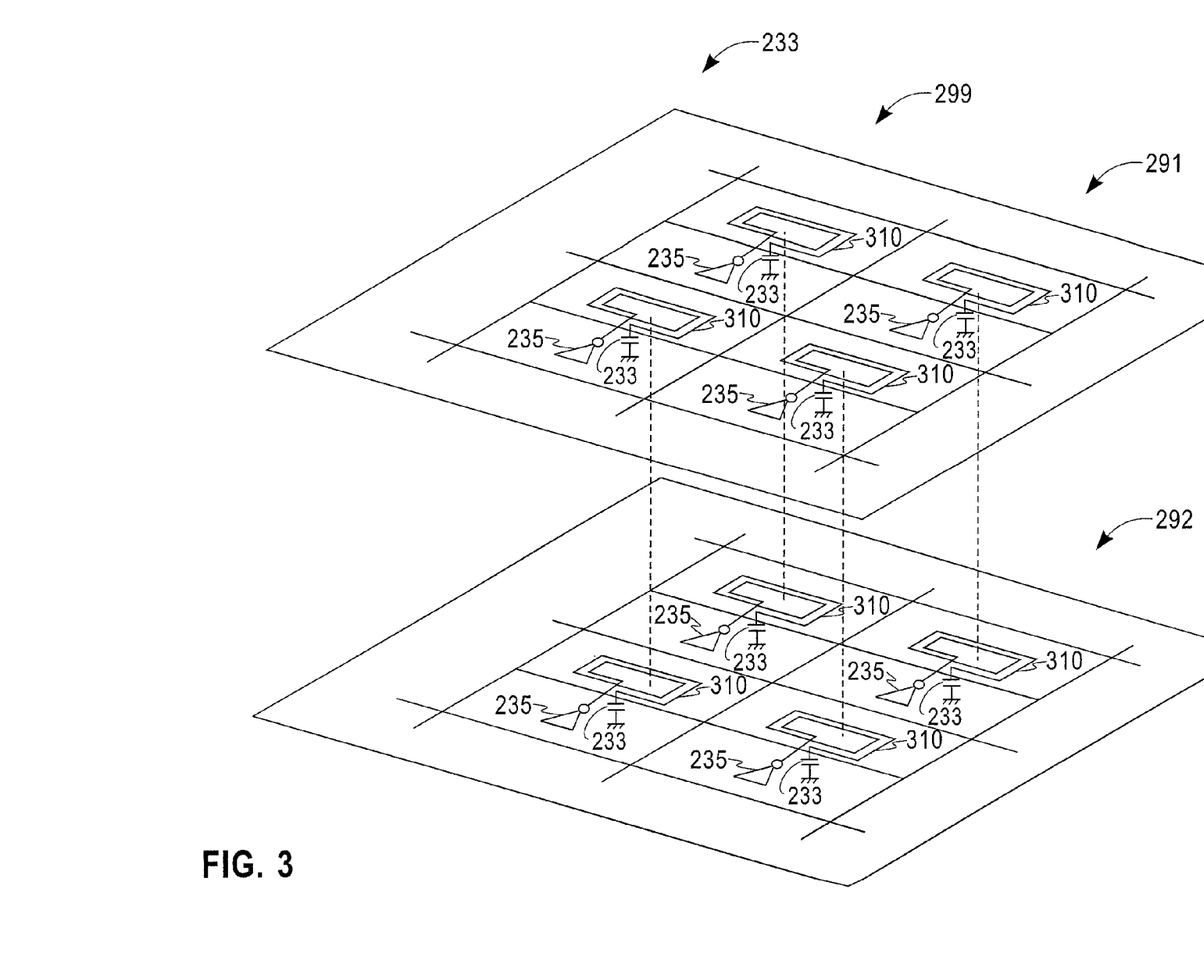
FIG. 3 shows an alignment 300 between the coils 310 of the inductors 234 of the resonant circuits 255 of FIG. 2, in accordance with an embodiment of the present principles.
Figure 4:
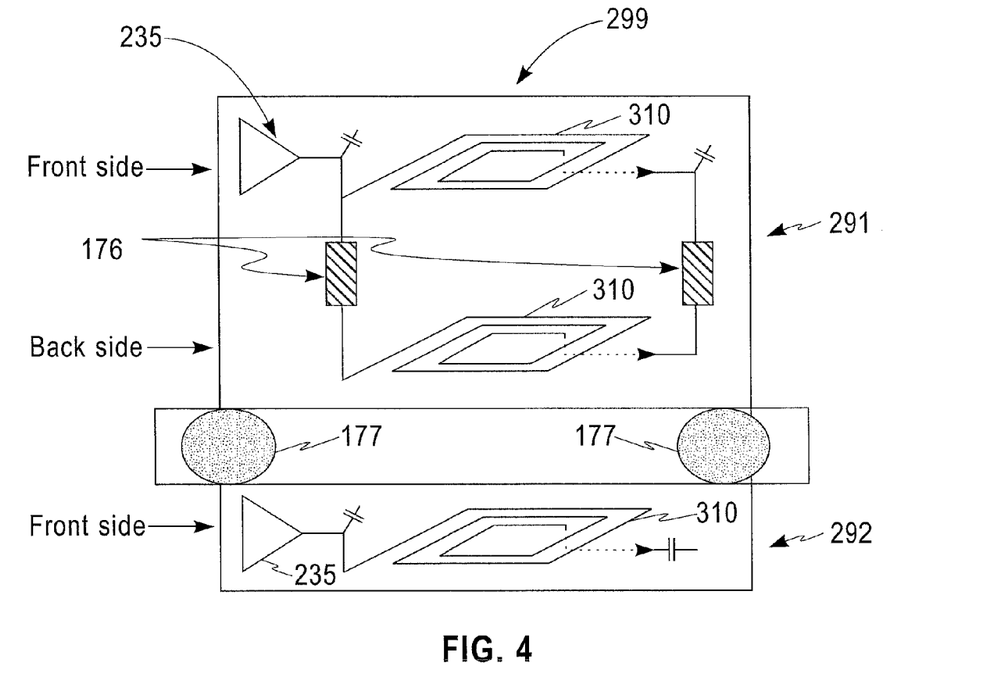
FIG. 4 shows a coupling enhancement 400 for the resonant circuits 255 of FIG. 2, in accordance with an embodiment of the present principle.

FIG. 3 shows an alignment 300 between the coils 310 of the inductors 234 of the resonant circuits 255 of FIG. 2, in accordance with an embodiment of the present principles. The coils 310 of the inductors 234 of the LC tank circuits 255 are aligned for the corresponding sector in each stratum to force the inductors 234 to resonant at the same phase, thus minimizing skew. The alignment of the 310 coils of the inductors 234 eliminates the need of physically connecting the clock network through the stack 299. Moreover, the coupled inductors help "pull in" the phase difference between two or more resonant nodes, as explained above FIG. 4 shows a coupling enhancement 400 for the resonant circuits 255 of FIG. 2, in accordance with an embodiment of the present principle. When stacked with a front-to-back or back-to-back configuration, the coupling can be enhanced by a back side inductor 434 which is formed by the re-distribution layer (RDL) metal layers. The term "front" refers to the side of the chip that has the active electronics thereon.

The sector buffers 235 that drive the sectors within which the coils 310 are located are connected using TSVs 176 and/or μC4 277.

Figure 5:
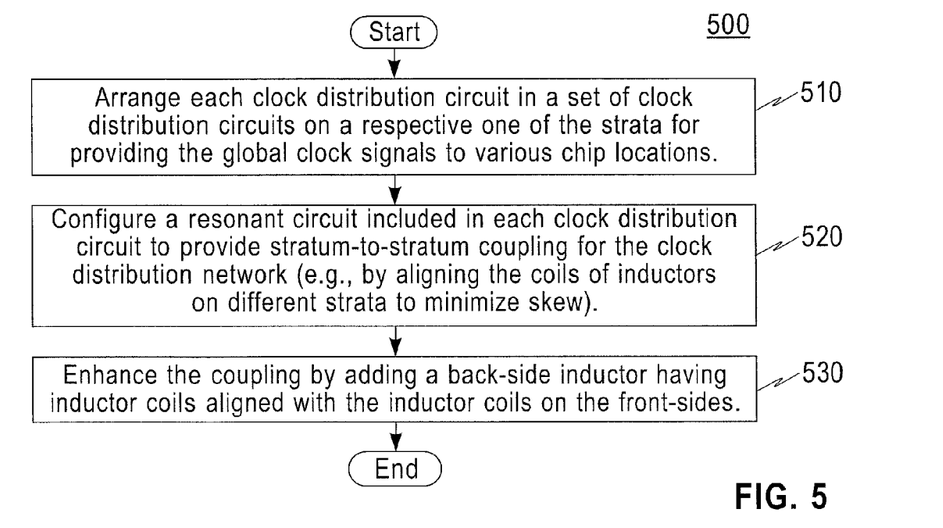
FIG. 5 shows a method 500 for reducing skewing of global clock signals within a 3D chip stack that includes two or more strata, in accordance with an embodiment of the present principles.

FIG. 5 shows a method 500 for reducing skewing of global clock signals within a 3D chip stack that includes two or more strata, in accordance with an embodiment of the present principles.

At step 510, each clock distribution circuit in a set of clock distribution circuits is arranged on a respective one of the two or more strata for providing the global clock signals to various chip locations.

At step 520, a respective resonant circuit included in each clock distribution circuit is configured to provide stratum-to-stratum coupling for the clock distribution network. The resonant circuit includes at least one capacitor and at least one inductor.

It is to be appreciated that step 520 may involve, e.g., aligning the coils of inductors on the different strata to minimize signal skew. For example, the coils of co-located (essentially the same position, but on different strata) inductors may be aligned.

Moreover, it is to be appreciated that the two or more strata may be configured with a front-to-back configuration or a back-to-back configuration, and the inductors coils that are aligned to form the coupling are located on respective front-sides of the two or more strata. In such a case, at step 530, the coupling is enhanced by adding a back-side inductor having inductor coils aligned with the inductor coils on the front-sides. For example, the back-side inductor is formed by the register transfer level metal layer.

Having described preferred embodiments of a system and method (which are intended to be illustrative and not limiting), it is noted that modifications and variations can be made by persons skilled in the art in light of the above teachings It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A clock distribution network for synchronizing global clock signals within a 3D chip stack having two or more strata, the clock distribution network comprising:
a plurality of clock distribution circuits, each being arranged on a respective one of the two or more strata for providing the global clock signals to various chip locations;
wherein each of the plurality of clock distribution circuits comprises a resonant circuit for providing stratum-to-stratum coupling for the clock distribution network, the resonant circuit including at least one capacitor and at least one inductor.

2. The clock distribution network of claim 1, wherein inductor coils included within the resonant circuit on at least two of the two or more strata are aligned with respect to each other to form a coupling there between to reduce skewing of the global clock signals with respect to the various chip locations.

3. The clock distribution network of claim 2, wherein the two or more strata are configured with a front-to-back configuration or a back-to-back configuration, wherein the inductor coils that are aligned to form the coupling are located on respective front-sides of the two or more strata, and the coupling is enhanced by adding a back-side inductor having inductor coils aligned with the inductor coils on the front-sides.

4. The clock distribution network of claim 3, wherein the back-side inductor is formed by a re-distribution layer.

5. The clock distribution network of claim 1, wherein each of the plurality of clock distribution circuits comprises a respective one of a plurality of clock grids for providing the global clock signals to the various locations on the two or more strata.

6. The clock distribution network of claim 5, wherein each of the plurality of clock grids comprises at least one sector having the resonant circuit therein for providing stratum-to-stratum coupling for the clock distribution network.

7. The clock distribution network of claim 5, wherein each of the plurality of clock distribution circuits further comprises a respective one of a plurality of buffered clock trees, each of the plurality of buffered clock trees for driving a corresponding one of the plurality of clock grids on a same one of the two or more strata and having at least a root and a plurality of clock buffers.

8. The clock distribution network of claim 7, wherein each of the plurality of clock distribution circuits further comprises a respective one of a plurality of multiplexers, the plurality of multiplexers for providing a same single clock source to the root of each of the plurality of buffered clock trees.

9. The clock distribution network of claim 8, wherein the plurality of multiplexers comprise at least one tri-state multiplexer.

10. The clock distribution network of claim 8, wherein a particular one of the plurality of multiplexers from a particular one of the two or more strata selects the same single clock source, and provides the same single clock source to remaining ones of the plurality of multiplexers using chip-to-chip interconnects.

11. The clock distribution network of claim 6, wherein the plurality of clock buffers respectively included in each of the plurality of buffered clock trees comprise a sector clock buffer for driving the respective one of the plurality of clock grids and a plurality of clock relay buffers for relaying the global clock signals.

12. The clock distribution network of claim 11, wherein the at least one sector is connected to and driven by the sector clock buffer.

13. A clock distribution network for synchronizing global clock signals within a 3D chip stack having two or more strata, the clock distribution network comprising:
a plurality of clock grids, each being arranged on a respective one of the two or more strata for providing the global clock signals to various chip locations;
a plurality of buffered clock trees, each being arranged on the respective one of the two or more strata for driving a respective one of the plurality of clock grids on a same one of the two or more strata and having at least a root and a plurality of clock buffers;
a plurality of multiplexers, each being arranged on the respective one of the two or more strata, the plurality of multiplexers for providing a same single clock source to the root of each of the plurality of buffered clock trees,
wherein each of the plurality of clock grids comprises at least one sector having a resonant circuit therein for providing stratum-to-stratum coupling for the clock distribution network.

14. The clock distribution network of claim 13, wherein the plurality of clock buffers respectively included in each of the plurality of buffered clock trees comprise a sector clock buffer for driving the respective one of the plurality of clock grids and a plurality of clock relay buffers for relaying the global clock signals.

15. The clock distribution network of claim 14, wherein the at least one sector is connected to and driven by the sector clock buffer.

16. The clock distribution network of claim 13, wherein a particular one of the plurality of multiplexers from a particular one of the two or more strata selects the same single clock source, and provides the same single clock source to remaining ones of the plurality of multiplexers using chip-to-chip interconnects.

17. The clock distribution network of claim 13, wherein inductor coils comprised within the resonant circuit on at least two of the two or more strata are aligned with respect to each other to form a coupling there between to reduce skewing of the global clock signals with respect to the various locations.

18. The clock distribution network of claim 17, wherein the inductor coils within the at least one sector on a given one of the two or more strata are aligned with the inductor coils within the least one sector corresponding thereto on another given one of the two or more strata.

19. The clock distribution network of claim 17, wherein the two or more strata are configured with a front-to-back configuration or a back-to-back configuration, wherein the inductor coils that are aligned to form the coupling are located on respective front-sides of the two or more strata, and the coupling is enhanced by adding a back-side inductor having inductor coils aligned with the inductor coils on the front-sides.

20. The clock distribution network of claim 19, wherein the back-side inductor is formed by a re-distribution layer.

* * * * *